United States Patent
Beaumont et al.

(10) Patent No.: US 10,604,864 B2
(45) Date of Patent: Mar. 31, 2020

(54) METHOD FOR THE PRODUCTION OF WAFERS OF NITRIDE OF ELEMENT 13, HAVING A NON-ZERO TRUNCATION ANGLE

(71) Applicant: Saint-Gobain Lumilog, Courbevoie (FR)

(72) Inventors: Bernard Beaumont, Le Tignet (FR); Vianney Le Roux, Antibes (FR); Jason Cole, Webster, MA (US)

(73) Assignee: Saint-Gobain Lumilog (FR)

( * ) Notice: Subject to any disclaimer, the term of this patent is extended or adjusted under 35 U.S.C. 154(b) by 0 days.

(21) Appl. No.: 15/534,666

(22) PCT Filed: Dec. 11, 2015

(86) PCT No.: PCT/FR2015/053434
§ 371 (c)(1),
(2) Date: Jun. 9, 2017

(87) PCT Pub. No.: WO2016/092226
PCT Pub. Date: Jun. 16, 2016

(65) Prior Publication Data
US 2018/0155852 A1 Jun. 7, 2018

(30) Foreign Application Priority Data
Dec. 11, 2014 (FR) .................... 14 62283

(51) Int. Cl.
*C30B 25/18* (2006.01)
*C30B 29/40* (2006.01)
(Continued)

(52) U.S. Cl.
CPC ............ *C30B 29/406* (2013.01); *C30B 25/04* (2013.01); *C30B 25/18* (2013.01); *C30B 29/403* (2013.01);
(Continued)

(58) Field of Classification Search
CPC .......... C30B 25/18; C30B 25/02; C30B 29/38
See application file for complete search history.

(56) References Cited

U.S. PATENT DOCUMENTS 7,915,152 B2 * 3/2011 Vaudo .................... C30B 23/00
117/87
8,575,728 B1 * 11/2013 Raring .................... H01L 33/16
257/628
(Continued)

FOREIGN PATENT DOCUMENTS

EP 1338683 A2 8/2003
EP 1699951 A2 9/2006
(Continued)

OTHER PUBLICATIONS

French Preliminary Search Report for French Application No. 1462283, dated Oct. 21, 2015.
(Continued)

*Primary Examiner* — Robert M Kunemund
(74) *Attorney, Agent, or Firm* — Lerner, David, Littenberg, Krumholz & Mentlik, LLP

(57) ABSTRACT

The invention relates to a method for production of wafers of nitrides of element (13) (5a, 5b, 5c, 5d) from a self-supported crystal of nitride of element (13), extending longitudinally along a main axis orthogonal to a growth face of the crystal and passing through the centre of said growth face, the crystal (10) having a truncation angle with a non-zero value, remarkable in that the method comprises a phase of cutting the self-supported crystal along the transverse cutting planes of the crystal in order to obtain wafers of nitride of element (13), each wafer including a front face having a non-zero truncation angle in the vicinity of the centre of the front face.

19 Claims, 5 Drawing Sheets

(51) Int. Cl.
*C30B 25/04* (2006.01)
*H01L 21/02* (2006.01)
*C30B 33/00* (2006.01)
*H01L 33/32* (2010.01)

(52) U.S. Cl.
CPC ........ *C30B 33/00* (2013.01); *H01L 21/02002* (2013.01); *H01L 33/32* (2013.01)

(56) References Cited

U.S. PATENT DOCUMENTS

| | | |
|---|---|---|
| 2002/0152952 A1 | 10/2002 | Beaumont et al. |
| 2005/0208687 A1 | 9/2005 | Kasai et al. |
| 2005/0217565 A1 | 10/2005 | Lahreche et al. |
| 2006/0228584 A1* | 10/2006 | Xu .................... C30B 25/18 428/698 |
| 2007/0072396 A1 | 3/2007 | Feltin et al. |
| 2008/0265379 A1* | 10/2008 | Brandes ............ H01S 5/32341 257/627 |
| 2011/0006397 A1 | 1/2011 | Fujikura et al. |
| 2011/0089536 A1* | 4/2011 | Brandes ............ H01S 5/32341 257/615 |
| 2012/0184090 A1 | 7/2012 | Ueno |

FOREIGN PATENT DOCUMENTS

| | | |
|---|---|---|
| EP | 1977028 A1 | 10/2008 |
| JP | S5659699 A | 5/1981 |
| WO | 9920816 A1 | 4/1999 |
| WO | 2007068756 A1 | 6/2007 |

OTHER PUBLICATIONS

International Search Report for Application No. PCT/FR2015-053434, dated Mar. 10, 2016.

Farrell, R.M., et al. "Effect of carrier gas and substrate misorientation on the structural and optical properties of m-plane InGaN/GaN light-emitting diodes", Journal of Crystal Growth, Dec. 15, 2010 (Dec. 15, 2010), pp. 1-7, vol. 313, No. 1, Elsevier, Amsterdam, NL.

Yuasa, T., et al., "Effect of Slight Misorientation of Sapphire Substrate on Metalorganic Chemical Vapor Deposition Growth of GaN", Journal of Applied Physics, Jul. 1, 1999, pp. L703-L705, Part 2, vol. 38, No. 7A.

* cited by examiner

US 10,604,864 B2

METHOD FOR THE PRODUCTION OF WAFERS OF NITRIDE OF ELEMENT 13, HAVING A NON-ZERO TRUNCATION ANGLE

CROSS REFERENCE TO RELATED APPLICATIONS

The present application is a national phase entry under 35 U.S.C. § 371 of International Application No. PCT/FR2015/053434, filed Dec. 11, 2015, published in French, which claims priority from French Patent Application No. 1462283 filed Dec. 11, 2014, all of which are incorporated herein by reference.

TECHNICAL FIELD

The invention relates to the general technical field of fabricating semiconductor material based on elements of groups 13 and 15 of the periodic table—such as gallium nitride GaN.

Notably, the present invention relates to the fabrication of group-13-element nitride wafers having a non-zero offcut angle.

In the context of the present invention, the offcut angle at a point on the surface of a wafer is defined by the angle between:
- the normal to a front face of the group-13-element nitride wafer (normal at the point for which the offcut angle is defined) and
- the normal (also known as the c-axis) to a c-oriented (0001) crystal plane (normal to the crystal plane at the aforesaid point).

Such a group-13-element nitride wafer may be intended for the production of semiconductor structures such as light-emitting diodes (LEDs) or laser diodes (LDs).

PRESENTATION OF THE PRIOR ART

The current methods of fabricating semiconductor materials based on group-13-element nitride rest on the so-called heteroepitaxy technique which consists of growing a crystal (such as a gallium nitride GaN crystal) on a starting substrate of different nature (such as a sapphire substrate).

However, the heteroepitaxy technique induces numerous crystal defects in the group-13-element nitride structure, such as dislocations, limiting the performance and the lifespan of group-13-element nitride-based components.

These defects are due to the differences in material between the starting substrate and the group-13-element nitride layer, and notably to the mismatched:
- crystal lattice parameters (i.e., lattice parameter) between the starting substrate and the group-13-element nitride layer, and
- coefficient of thermal expansion between the starting substrate and the group-13-element nitride layer.

Generally, the known fabrication methods make it possible to obtain c-oriented (0001) group-13-element nitride layers from c-oriented (0001) sapphire ($Al_2O_3$) starting substrates.

The group-13-element nitride layers thus fabricated have an offcut angle of zero. Such group-13-element nitride layers are of very good quality since some have a limited number of crystal defects (threading dislocation density (TDD) $<5 \cdot 10^8$ $cm^{-2}$).

The optoelectronic components produced on zero offcut group-13-element nitride layers have certain unfavorable properties such as high surface roughness of the epitaxial layers, or a lower capacity to incorporate elements such as indium, for example.

Other known fabrication methods make it possible to obtain group-13-element nitride crystals having a non-zero offcut angle, in order to produce optoelectronic components not having the above-mentioned disadvantages.

The document JP 56059699, for example, describes the possibility of fabricating a group-13-element nitride crystal the offcut angle of which is between 0.5 and 4 degrees, said crystal being obtained by epitaxy on a sapphire substrate having an offcut angle between 0.5 and 4 degrees.

However, even if epitaxial growth on a non-zero offcut angle substrate makes it possible to obtain a group-13-element nitride crystal having a non-zero offcut angle, the crystalline quality of such a crystal is insufficient to allow the fabrication of optoelectronic components, notably due to the presence of stacking faults and dislocations.

The article "Effect of Slight Misorientation of Sapphire Substrate on Metalorganic Chemical Vapor Deposition Growth of GaN" by Takayuki Yuasa et al. (Journal of Applied Physics Vol. 38 (1999) pp. L703-705, Part 2, No. 7A, 1 Jul. 1999) shows the interest in using a sapphire substrate having an offcut angle on the order of 0.1 to 0.2 degrees for producing a GaN crystal with uniform morphology, the use of a starting substrate with too-high an offcut angle producing a GaN crystal having a scale-type growth face. For certain applications, however, offcut angles so small and in so limited a range may be insufficient.

For larger offcut angles, the document US 2012/0184090 proposes a method wherein group-13-element nitride wafers having a non-zero offcut angle are obtained by cutting a thick zero offcut group-13-element nitride ingot.

More precisely, the method described in US 2012/0184090 consists of:
- growing a zero offcut group-13-element nitride ingot, and
- cutting the ingot along inclined cutting planes parallel to the crystallization plane at the periphery of said ingot.

This makes it possible to obtain group-13-element nitride wafers having a non-zero offcut angle in the central region of the wafer, the offcut angle decreasing in a peripheral region of the wafer.

Such group-13-element nitride wafers having a non-zero offcut angle have a crystalline quality equivalent to that of group-13-element nitride layers having an offcut angle of zero.

However, cutting a thick ingot along an inclined cutting plane causes significant loss of material.

A goal of the present invention is to propose a method of fabricating group-13-element nitride wafers having a non-zero offcut angle the quality of which is substantially equivalent or even superior to that of group-13-element nitride layers having an offcut angle of zero, said method limiting loss of material and being able to be implemented with any type of starting substrate whatever its offcut angle, and notably with starting substrates having large offcut angles of up to 5 degrees.

SUMMARY OF THE INVENTION

To that end, the invention proposes a method of fabricating group-13-element nitride wafers from a free-standing group-13-element nitride crystal extending longitudinally along a principal axis orthogonal to a growth face of the crystal and passing through the center of said growth face, the crystal having an offcut angle with a non-zero value, remarkable in that said crystal is curved and in that the method comprises a phase of cutting the free-standing crystal along cutting planes transverse to the crystal and perpendicular to the principal axis of the crystal, so as to obtain group-13-element nitride wafers, each wafer including a front face having a non-zero offcut angle in the vicinity of the center of the front face.

One thus obtains wafers the largest dimension of the front face (the diameter in the case of a circular wafer) of which may vary typically between 30 millimeters and 200 millimeters as a function of the size of the starting substrate used (the largest dimension of which may be between 30-200 mm).

In the context of the present invention, by "vicinity of the center of a face" is meant a region of the face extending in a radius of 10 millimeters around the center of said face.

Unlike the ingot described in the document US 2012/0184090, the crystal according to the invention from which wafers are cut advantageously has an offcut angle different from zero on its growth face.

The inventors thus developed a machining method adapted to this configuration of the crystal. In particular, the inventors propose to cut the crystal along cutting planes (P) transverse to the crystal, in particular orthogonal to a principal axis (A) of the crystal. This makes it possible to obtain a much better yield of material than that described in the document US 2012/0184090.

Preferred but non-limiting aspects of the above-described method are described in the following sections.

The crystal has a radius of curvature of less than 25 meters, preferably of less than 20 meters.

The radius of curvature is 5 meters or more.

The crystal has a dislocation density of $10^7$ $cm^{-2}$ or less.

Advantageously, the non-zero offcut angle (of each wafer after the cutting phase) in the vicinity of the center of the front face is between 0.1 and 5 degrees, preferably between 0.2 and 0.8 degrees, even more preferably between 0.3 and 0.6 degrees, the cutting planes extending perpendicular to the principal axis (A) of the crystal.

The fact of cutting the crystal along cutting planes orthogonal to the principal axis makes it possible to obtain wafers the offcut angles of which are distributed symmetrically around the principal axis; this facilitates subsequent fabrication of optoelectronic components.

Preferably, the cutting planes extend:
perpendicular to the principal axis of the crystal, and
parallel to each other along said principal axis,
so as to obtain group-13-element nitride wafers having a thickness between 300 microns and 1 millimeter.

The fact of cutting the crystal along cutting planes parallel to each other makes it possible to obtain a plurality of wafers wherein the crystal planes are distributed homogeneously from one wafer to another; this also makes it possible to maximize the number of wafers cut from a crystal.

The method may further comprise:
a growth phase of a first group-13-element nitride layer on a starting substrate having a crystallization plane between 0.1 and 5 degrees, preferably between 0.2 and 0.8 degrees, and even more preferably between 0.3 and 0.6 degrees;
a separation zone formation phase;
a regrowth phase to form a second group-13-element nitride layer,
a separation phase to obtain the crystal.

Implementation of the phases of growth of a group-13-element nitride layer, of formation of a separation zone, of regrowth and of separation makes it possible to obtain a crystal having high quality and a particularly small radius of curvature (curved crystal), which makes the cutting phase according to the invention particularly reliable and fast.

According to an alternative embodiment, the separation zone formation phase comprises the deposition of a silicon layer on the starting substrate, said silicon layer being intended to be spontaneously vaporized during the growth phase of a first group-13-element nitride layer.

The fact of depositing a silicon sacrificial layer intended to be vaporized during the growth phase of the first group-13-element nitride layer makes it possible to limit crystal defects due to the coefficient of thermal expansion mismatch between the starting substrate and the group-13-element nitride layer; indeed, the silicon layer being vaporized during growth, the group-13-element nitride layer is no longer strained by the starting substrate, which limits its risks of cracking.

According to another alternative embodiment, the separation zone formation phase comprises an ion implantation step, which may be implemented before, during or after the growth phase of the first group-13-element nitride layer.

Implementation of an implantation step makes it possible to create a weakened zone at the interface between the starting substrate and the first group-13-element nitride layer.

Implementation of the implantation step prior to the growth phase of the first group-13-element nitride layer makes it possible to:
facilitate separation of the first group-13-element nitride layer, and
improve the flatness of the first group-13-element nitride layer.

In an embodiment, the growth phase of the first group-13-element nitride layer is a phase of epitaxial lateral overgrowth (ELO) or of universal lateral overgrowth (ULO) of the first group-13-element nitride layer.

Implementation of a phase of lateral overgrowth (ELO or ULO) to form the first group-13-element nitride layer makes it possible to improve the quality of the first group-13-element nitride layer grown epitaxially, notably by bending the dislocations during the lateral growth step.

Optionally, the growth phase of the first group-13-element nitride layer comprises:
a step of depositing a mask having openings,
a step of growing islands of group-13-element nitride through the openings, the islands having a crystallization plane between 0.1 and 5 degrees, preferably between 0.2 and 0.8 degrees, and even more preferably between 0.3 and 0.6 degrees,
a lateral growth step to promote the coalescence of the islands in order to obtain the first group-13-element nitride layer.

The fact of depositing a mask during the ELO phase makes it possible to weaken the interface between the starting substrate and the first group-13-element nitride layer.

According to another aspect of the present invention, the growth phase of the first group-13-element nitride layer comprises a step of depositing a group-13-element nitride buffer layer at a temperature between 500 and 700° C.

The buffer layer provides a "gentle" transition between the starting substrate and the first group-13-element nitride layer. Low-temperature (i.e., between 500 and 700° C.) deposition of the buffer layer makes it possible to improve the quality of the group-13-element nitride layer by filtering crystal defects related to the lattice parameter mismatch between the starting substrate and the group-13-element nitride layer.

Preferably, the growth phase of the first group-13-element nitride layer comprises a step of annealing the buffer layer at a temperature between 900 and 1150° C. so as to convert the initially continuous buffer layer into a discontinuous layer of group-13-element nitride features.

The annealing step facilitates separation of the first group-13-element nitride layer by converting the initially continuous buffer layer into a discontinuous layer of group-13-element nitride features.

The invention also relates to a group-13-element nitride wafer that can be obtained by implementing the above-described method, which comprises a front face having a non-zero offcut angle ($\alpha 1$) in the vicinity of the center of the front face, remarkable in that the offcut angle values are distributed in a substantially symmetrical way around a symmetry plane containing:
- a principal axis A-A' of the wafer orthogonal to the front face and passing through the center of the front face, and
- a c-axis orthogonal to a c-oriented crystal plane.

According to another aspect of the present invention, the group-13-element nitride wafer comprises a surface opposite its concave front face, and the offcut angle tends to decrease towards the periphery along the symmetry plane.

In another embodiment, the group-13-element nitride wafer comprises a surface opposite its convex front face, and the offcut angle tends to increase towards the periphery along the symmetry plane.

The invention also relates to the use of a group-13-element nitride wafer as described above for fabricating optoelectronic components.

BRIEF DESCRIPTION OF THE DRAWINGS

Other advantages and features of the method according to the invention and of the associated product will become more apparent from the following description of several alternative embodiments, given as non-limiting examples, in reference to the appended drawings wherein.

DETAILED DESCRIPTION OF THE INVENTION

Various exemplary methods of fabricating semiconductor wafers, and of the wafers thus obtained, will now be described in further detail in reference to the figures.

In these various figures, the equivalent elements bear the same numerical labels. The method according to the invention will be described below in reference to the fabrication of gallium nitride GaN wafers.

However, it is quite obvious to the person skilled in the art that the method described below may be used to grow a material including a group-13-element nitride layer other than gallium nitride GaN.

1. Fabrication Method

Figure 1:
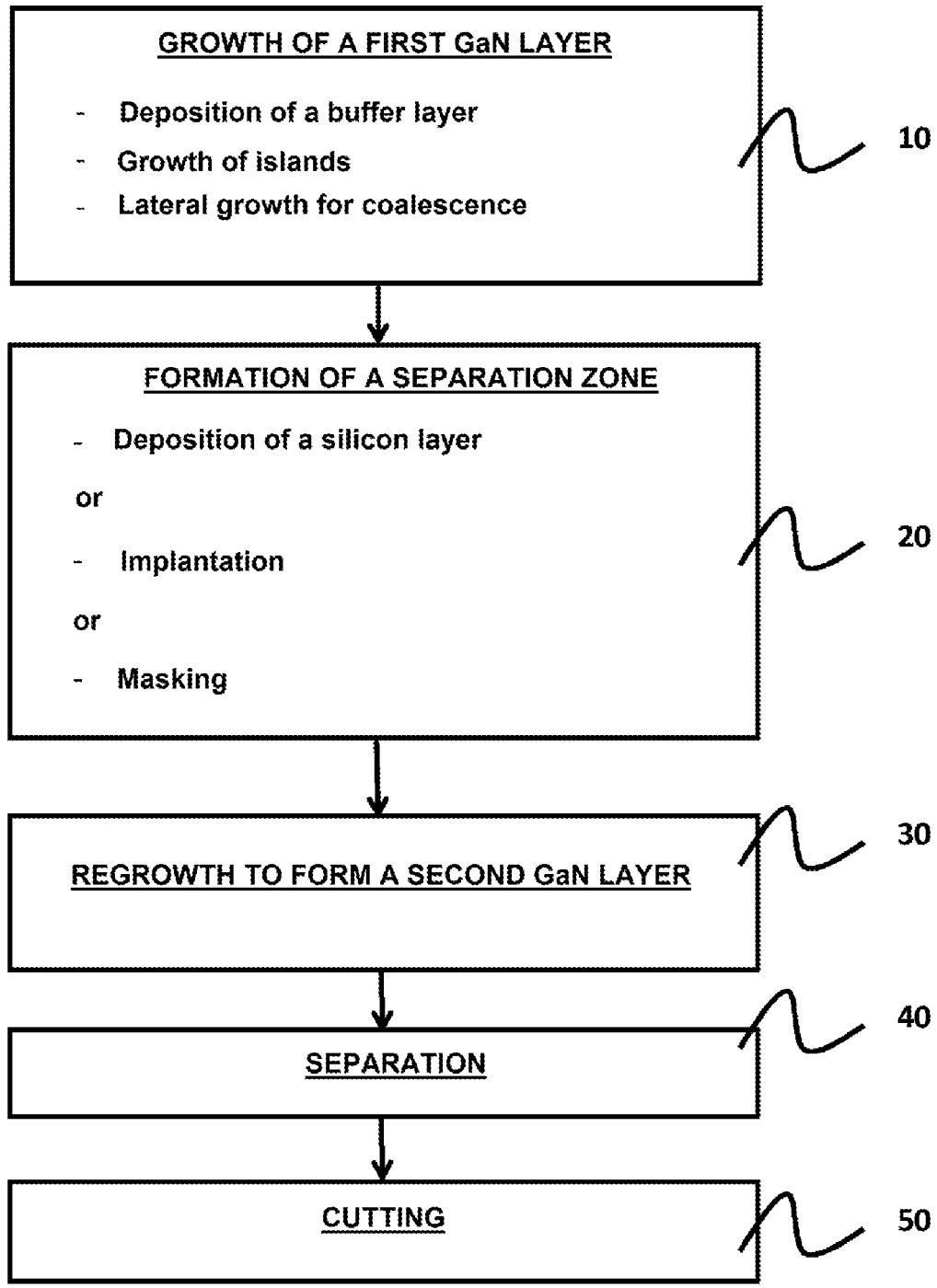
FIG. 1 illustrates an exemplary fabrication method according to the invention.
Figure 2:
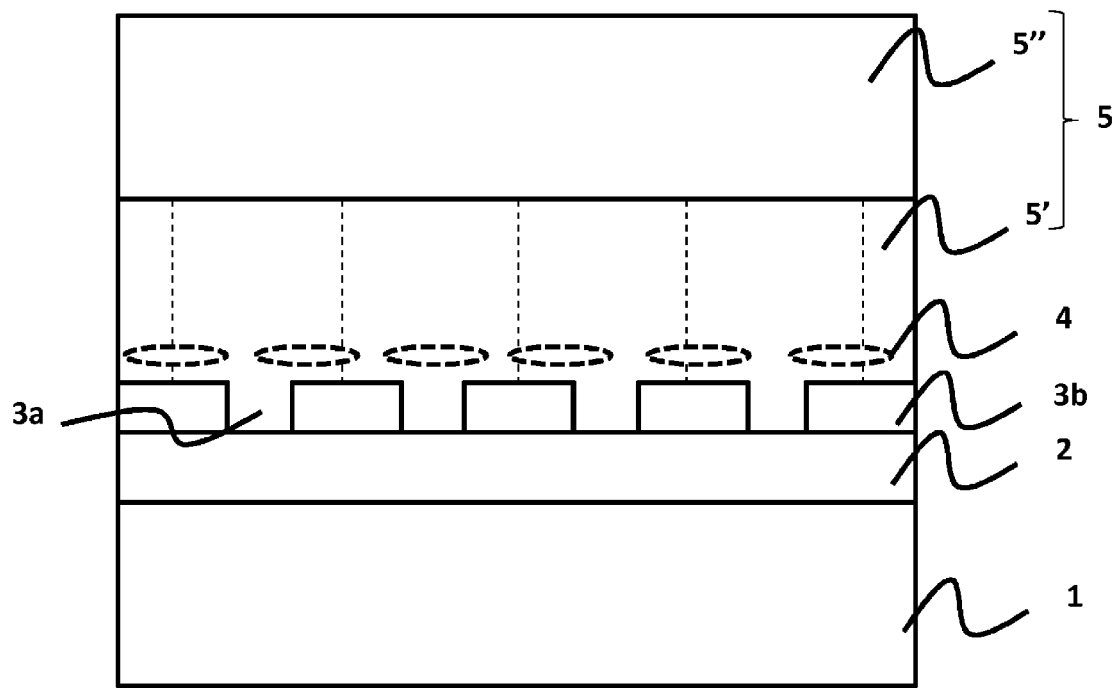
FIG. 2 schematically illustrates a semiconductor material composed of a stack of layers.

The main phases of the method of fabricating GaN wafers are illustrated in FIG. 1.

The method comprises:
i) a growth phase 10 of a first GaN layer 5',
ii) a formation phase 20 of a separation zone 4,
iii) an epitaxial regrowth phase 30 to form a second thick GaN layer 5'',
iv) a separation phase 40 to obtain a GaN crystal 5,
v) a cutting phase 50 of the GaN crystal 5 to form GaN wafers 5a-5d.

1.1. Growth Phase 10

The growth phase 10 consists of forming a first GaN layer 5' by lateral overgrowth.

Lateral overgrowth makes it possible to minimize the defect density in the first GaN layer 5'.

The approach used to reduce the dislocation density in the first GaN layer 5' consists of:
- initiating a mode of GaN growth as islands, then of
- promoting the coalescence of the islands to obtain the first GaN layer 5'.

Advantageously, lateral overgrowth is implemented on a starting substrate 1 having a non-zero offcut angle.

The fact of using a starting substrate 1 having a non-zero offcut angle makes it possible to grow a first GaN layer 5' having a non-zero offcut angle.

The starting substrate 1 may be selected from Si, AlN, GaN, GaAs, $Al_2O_3$ (sapphire), ZnO, SiC, $LiAlO_2$, $LiGaO_2$, $MgAl_2O_4$, 4H—SiC, or any other type of starting substrate known to the person skilled in the art for growing gallium nitride. It may have a thickness of a few hundred microns, generally 350 microns. Advantageously, the starting substrate 1 may be treated by nitriding prior to any deposition step. This improves the quality of the GaN crystal obtained at the conclusion of step iv).

The offcut angle may be between 0.1 and 5 degrees, preferably between 0.2 and 0.8 degrees, and even more preferably between 0.3 and 0.6 degrees (notably to limit stacking faults).

Growth of the first GaN layer 5' may be implemented according to different variants. Notably, lateral overgrowth may be based on the use of:
- a dielectric mask 3a, 3b having openings 3a in which islands are formed, as described in the document WO99/20816;
- a dielectric layer having no openings on which islands are spontaneously formed, as described in the document EP 1 338 683.

1.1.1. First Variant of Lateral Overgrowth

In a first variant, the growth phase 10 consists of epitaxial lateral overgrowth (ELO).

ELO comprises a step of depositing a buffer layer 2 on the starting substrate 1.

This deposition is preferably carried out by metalorganic vapor phase epitaxy (MOVPE), for example at a temperature between 500° C. and 700° C., notably of 600° C.

The deposition of a buffer layer 2 reduces the strain between the starting substrate 1 and the first GaN layer 5' subsequently grown epitaxially thereon. Indeed, the deposition of the buffer layer 2 on the substrate 1 provides a "gentle" transition between the different crystal structures of the substrate 1 and the first GaN layer 5'.

The deposition of the buffer layer 2 further makes it possible to facilitate the subsequent separation of the GaN crystal 5, as will become apparent from the following description. The buffer layer 2 is for example a GaN layer, an AlN layer, or an AlGaN layer.

In another step, a mask 3a, 3b having openings 3a is formed. The openings 3a may be discrete or in the form of strips and make it possible to define positions for the subsequent selective growth of GaN islands.

The mask 3a, 3b may be a mask made of dielectric material, such as for example $SiN_x$ (SiN, $Si_3N_4$, etc.) or $SiO_2$ or TiN. This makes it possible to minimize defects created at the edge of the mask and thus improves the quality of the GaN layer subsequently grown epitaxially thereon.

Formation of the mask 3a, 3b may be carried out by any technique known to the person skilled in the art. For example, formation of the mask may consist of:
  depositing a dielectric layer 3a from ammonia and silane precursor gases directly on the buffer layer 2, and
  photolithographic engraving of the dielectric layer 3a to form openings 3a.

A starting substrate 1 covered with a buffer layer 2 and a mask 3a, 3b is thus obtained. Beyond its function of improving the quality of the first GaN layer 5' (by filtering through-type defects), the mask 3a, 3b weakens the interface between the starting substrate 1 and the first GaN layer 5'.

Another step consists of forming GaN islands through the openings 3a of the mask. The growth rate along an axis orthogonal to the principal plane of the starting substrate 1 is maintained higher than the lateral growth rate. Islands or strips having a triangular cross-section are thus obtained (as a function of the shape of the openings 3a). Inside these triangular cross-sectional strips, through-type dislocations are bent at 90°.

Lateral overgrowth is then carried out, ultimately leading to a planar ELO layer. At the end of this step of the method, a first GaN layer 5' having a dislocation density below $10^7$ $cm^{-2}$ is obtained.

1.1.2. Second Variant of Lateral Overgrowth

In a second variant, the growth phase 10 consists of universal lateral overgrowth (ULO) as described in the document EP 1 977 028.

ULO comprises a step of depositing a nucleation layer on the starting substrate 1.

The nucleation layer is for example a very thin silicon nitride SiN film, on the order of a few atomic planes, i.e., on the order of 10 nm to 20 nm in thickness. The deposition of SiN from silane and ammonia may last 360 seconds.

A continuous buffer layer 2—for example of GaN—is then deposited on the nucleation layer. The deposition of the GaN buffer layer 2 makes it possible to filter crystal defects and thus to minimize from the beginning of the method the defect density in the first GaN layer 5' subsequently grown epitaxially.

The thickness of this GaN buffer layer 2 may be between 10 and 100 nm. The temperature during this operation may be between 500 and 700° C.

One then proceeds to high-temperature annealing between 900 and 1150° C. Under the joint effect of the increased temperature, of the presence in the carrier gas of a sufficient quantity of hydrogen and of the presence of the very thin SiN film, the morphology of the GaN buffer layer 2 undergoes a profound change resulting from solid-phase recrystallization by mass transport. The initially continuous GaN buffer layer 2 is then converted into a discontinuous layer of GaN features. GaN features or islands of very good crystalline quality are thus obtained, these retaining an epitaxial relationship with the starting substrate by virtue of the very small thickness of the nucleation layer.

The regions where the silicon nitride SiN is exposed then function like a mask and the GaN features function like the GaN regions located in the openings made ex situ in the mask. Lateral overgrowth is then carried out, ultimately leading to a planar ULO layer.

This method, where the silicon nitride mask forms spontaneously, and which utilizes the same dislocation curvature mechanisms as in ELO, is called "ULO" (or "spontaneous ELO").

1.2. Formation Phase 20 of a Separation Zone 4

The method further comprises a formation phase 20 of a separation zone 4.

This separation zone formation phase 20 may be implemented according to different variants. In particular, the separation zone formation phase 20 may be implemented:
  prior to the growth phase 10 of the first GaN layer (first variant), or
  subsequent to the growth phase 10 of the first GaN layer (second variant)
  during the growth phase 10 of the first GaN layer (third variant).

1.2.1. First Variant of Formation of the Separation Zone 4

In a first variant, the formation phase 20 of a separation zone 4 may consist of depositing an intermediate silicon Si layer prior to the growth phase 10 of the first GaN layer 5', as described in the document EP 1 699 951.

The intermediate silicon Si layer serves as a sacrificial layer intended to be spontaneously vaporized during the subsequent epitaxial growth phase of the first GaN layer 5'.

Spontaneous vaporization of the intermediate silicon Si layer during the growth phase of the first GaN layer 5' reduces the density of crystal defects (in particular of dislocations) in the first GaN layer 5'.

1.2.2. Second Variant of Formation of the Separation Zone

In a second variant, the formation phase 20 of a separation zone 4 comprises an implantation step carried out after the growth phase 10 of the first GaN layer 5'. This implantation creates a weakened zone in the first GaN layer 5'.

The implantation consists of ion bombardment of the first GaN layer 5' so as to create in the semiconductor, at a depth near the mean penetration depth of these ions, a layer of microcavities (or bubbles).

The implanted ions may be selected from tungsten, helium, neon, krypton, chromium, molybdenum, iron, hydrogen, or boron. Preferably, the implanted ions are tungsten ions. The latter have the feature of decomposing GaN.

In terms of dose, when the implanted ions are H+ ions, the ion implantation dose may be between $10^{16}$ and $10^{17}$ $cm^{-2}$, and the implantation depth may vary between 0 nm and 50 nm starting from the free face—called the growth face—of the first GaN layer 5'.

Weakening ion implantation may be implemented during a single step or during successive steps. The temperature may be between 4K and 1000K during the implantation step.

1.2.3. Third Variant of Formation of the Separation Zone

In a third variant, the separation zone 4 may be formed during the growth phase 10 of the first GaN layer 5'.

Notably when the growth phase is carried out according to the first alternative embodiment, called ELO (i.e., deposition of a dielectric mask 3a, 3b), the formation phase 20 of the separation zone 4 may comprise the implantation of the buffer layer 2 prior to the deposition of the mask 3a, 3b.

This makes it possible to place the separation zone 4 at a precisely desired depth due to the fact that the first GaN layer 5' deposited during the ELO step does not interfere with ion implantation.

Of course, the implantation may be carried out at various stages of the ELO (or ULO) phase, either in the islands, or at an intermediate stage where the islands are not entirely coalesced, or after the total coalescence of the islands.

1.3. Epitaxial Regrowth Phase

At the conclusion of the formation phase 20 of a separation zone 4 and the growth phase 10 of the first GaN layer 5', the method includes an epitaxial regrowth phase in order to form a second thick GaN layer 5".

This epitaxial regrowth may be implemented:
by metalorganic vapor phase epitaxy (MOVPE),
by hydride vapor phase epitaxy (HVPE),
by closed-space vapor transport (CSVT), or
by liquid phase epitaxy (LPE).

It is preferred during this step to implement HVPE technology, which produces three advantageous main effects:
A first effect is that the first GaN layer 5' is made thicker without losing its crystalline qualities (no new dislocations or cracks are generated),
A second effect is that the dislocation density is further reduced during HVPE regrowth, by a factor at least equal to 2,
A third effect is that the thick GaN layer 5 thus obtained spontaneously separates from its starting substrate 1 at the separation zone 4.

A second GaN layer 5" extending on the first GaN layer 5' is thus obtained. The second GaN layer 5" has a non-zero offcut angle of constant value on its front face.

Indeed, the first and second GaN layers 5', 5" are formed on a substrate having a non-zero offcut angle of constant value on its growth face. However, this non-zero offcut angle of the starting substrate is propagated in the first and second layers during the growth phase 10 and the epitaxial regrowth phase 30.

This is why the front face of the second GaN layer 5" has a non-zero offcut angle of constant value at any point on its front face. More generally, at the various moments of the growth phase 10 and of the epitaxial regrowth phase 30, the front face of the first 5' or second 5" GaN layer has a non-zero offcut angle of constant value at any point on said face.

1.4. Separation Phase

A separation phase 40 is also implemented, it being dependent on the variant implemented for the formation phase 20 of the separation zone 4.

In the case of ion implantation, the spontaneous separation phase 40 takes place because of the thermal cycle (high-temperature epitaxial regrowth and cooling) applied to the thickened GaN layer 5 which, because of the difference in coefficients of thermal expansion between the starting substrate 1 and the thick GaN layer 5, generates stresses causing it to separate.

In the case of the deposition of an intermediate silicon layer, this separation occurs during epitaxial regrowth by spontaneous vaporization of the intermediate silicon layer.

Figure 3:
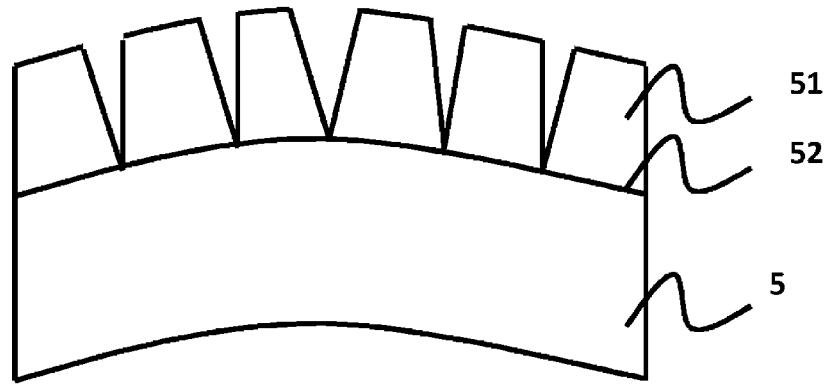
FIG. 3 illustrates a growth face of a free-standing group-13-element nitride crystal (or ingot)

A free-standing GaN crystal 5, as illustrated in FIG. 3, is thus obtained.

As is common in HYPE, the GaN crystal 5 comprises:
protrusions 51 in the form of hexagonal pyramids on a front face 52, and
geometrical patterns corresponding to the starting ELO structure on a back face, consisting of the fracture area (not shown).

Such a crystal is curved and has a radius of curvature of less than 25 meters and preferably of less than 20 meters (radius of curvature of the front face 52, like of the face of the crystal opposite said front face 52 and the protrusions 51). In the example of FIG. 3, this radius of curvature is 5 meters or more; furthermore, the crystal 5 has in addition a dislocation density of $10^7$ cm$^{-2}$ or less.

The GaN crystal 5 having been formed on a starting substrate having a non-zero offcut angle, it too has a non-zero offcut angle, the orientation of the crystal planes being propagated from one layer to another. For example, in the case of a sapphire substrate 1 having an offcut angle equal to 4 degrees, the growth face of the crystal 5 has an offcut angle equal to 4 degrees over its entire surface.

1.5. Cutting Phase

Once the GaN crystal 5 separates from the starting substrate 1, it is cut transversely into GaN wafers 5a, 5b, 5c, 5d.

Figure 4:
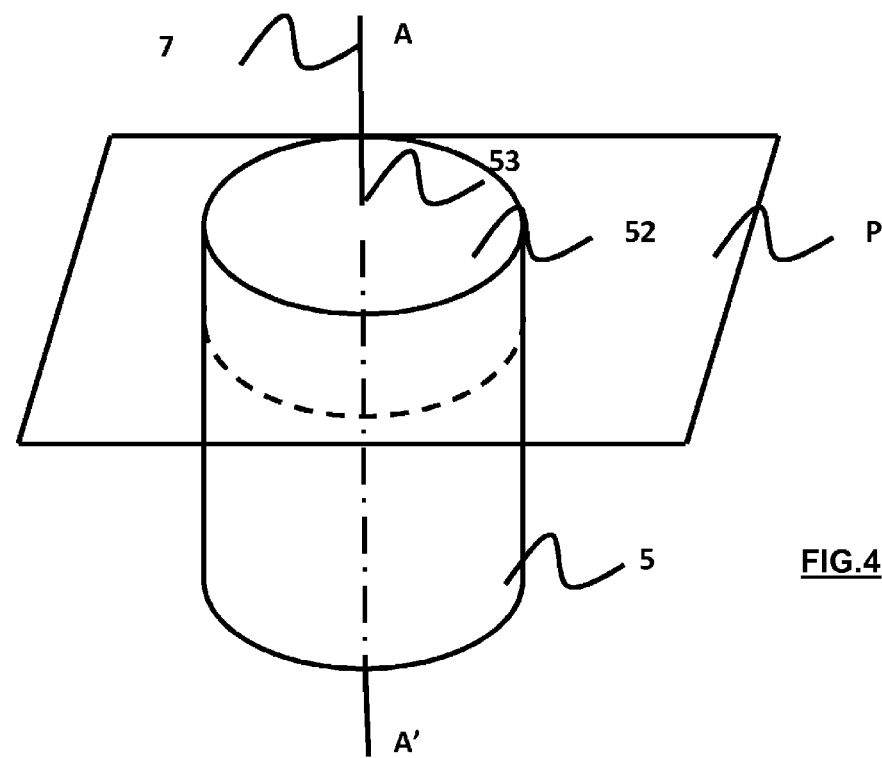
FIG. 4 illustrates an exemplary group-13-element nitride crystal.

As illustrated in FIG. 4, the GaN crystal 5 is elongated in shape and extends longitudinally along a principal axis A-A' (labeled 7). This principal axis 7 is coincident with the normal to the growth face 52 of the crystal 5 passing through the center 53 of said growth face 52.

For example, when the GaN crystal 5 is cylindrical in shape (or is inscribed in a cylindrical volume), the principal axis 7 corresponds to the axis of rotation of the cylinder.

Of course, the GaN crystal 5 may have other shapes, the shape of the GaN crystal 5 depending on the shape of the growth face of the starting substrate 1:
The GaN crystal 5 is for example cylindrical when the growth face of the starting substrate 1 is a disk,
The GaN crystal 5 is parallelepipedal when the growth face of the starting substrate 1 is square, rectangular, etc.

In all cases, the GaN crystal 5 is cut transversely so as to obtain GaN wafers. More precisely, the crystal 5 is cut along one (or more) cutting plane(s) substantially orthogonal to the principal axis 7, so as to limit loss of material to machining.

This makes it possible to obtain GaN wafers 5a, 5b, 5c, 5d having a reduced dislocation defect density and a longer lifespan.

The cutting phase 50 may be carried out by using a wire saw. The crystal for example is placed on a turntable. The turntable is then set in motion so as to turn the crystal 5 around its principal axis, the wire saw extending in a horizontal plane P perpendicular to the principal axis 7 of the crystal 5.

After having cut the crystal 5 along a first cutting plane P, the height of the wire saw is decreased so as to cut the crystal 5 along a second cutting plane (parallel to the first cutting plane).

Various wafers 5a, 5b, 5c, 5d are thus obtained, the thicknesses of which may vary as a function of the height at which the wire saw is positioned in relation to the crystal 5.

The crystal 5 (having a constant offcut angle at any point on its growth face) being "curved", and the cutting planes being orthogonal to its principal axis 7, wafers having special properties are obtained.

Notably, one of the features of the wafers 5a, 5b, 5c, 5d obtained by implementing the above-described method is that they have a non-zero offcut angle—notably between 0.1 and 5 degrees—in the vicinity of the center of their front face 54.

By "vicinity of the center of a face" is meant a region of the face extending in a radius of 10 millimeters around the center of said face.

Another feature of the wafers 5a, 5b, 5c, 5d thus obtained is that, on the front face of each wafer, the offcut angle values are distributed substantially symmetrically around a symmetry plane passing through the principal axis 7 of the wafer and the c-axis (orthogonal to the c-plane of crystallization (0001)).

Advantageously, post-treatment steps may be implemented on the wafers 5a, 5b, 5c, 5d once they are cut. Notably, each wafer may include a step of mechanical or chemical polishing so as to decrease the surface roughness thereof.

The reader will appreciate that the offcut angle of each wafer, the value of which is non-zero in the central region of the wafer, tends to vary when moving away from the center of the wafer along its symmetry plane.

Notably, the offcut angle value decreases or increases as a function of the concave or convex nature of the wafer.

Figure 6:
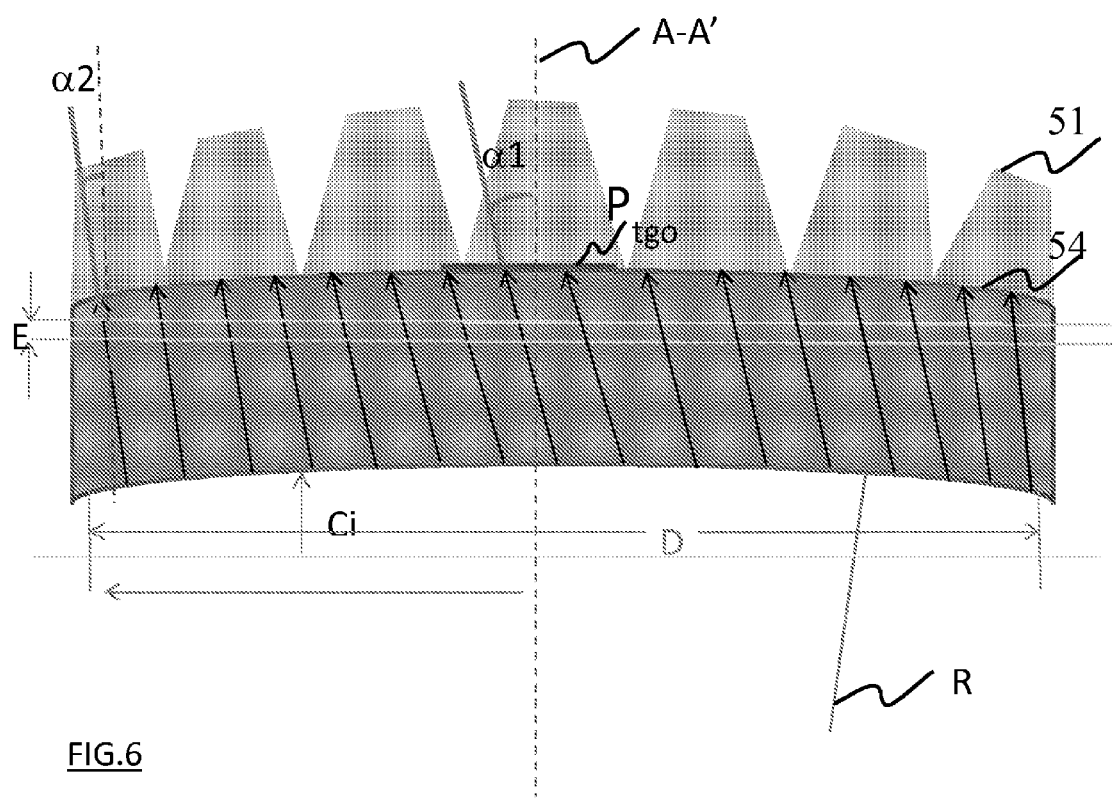
FIG. 6 is another representation illustrating various parameters influencing an embodiment in the case of a concave wafer.
Figure 7:
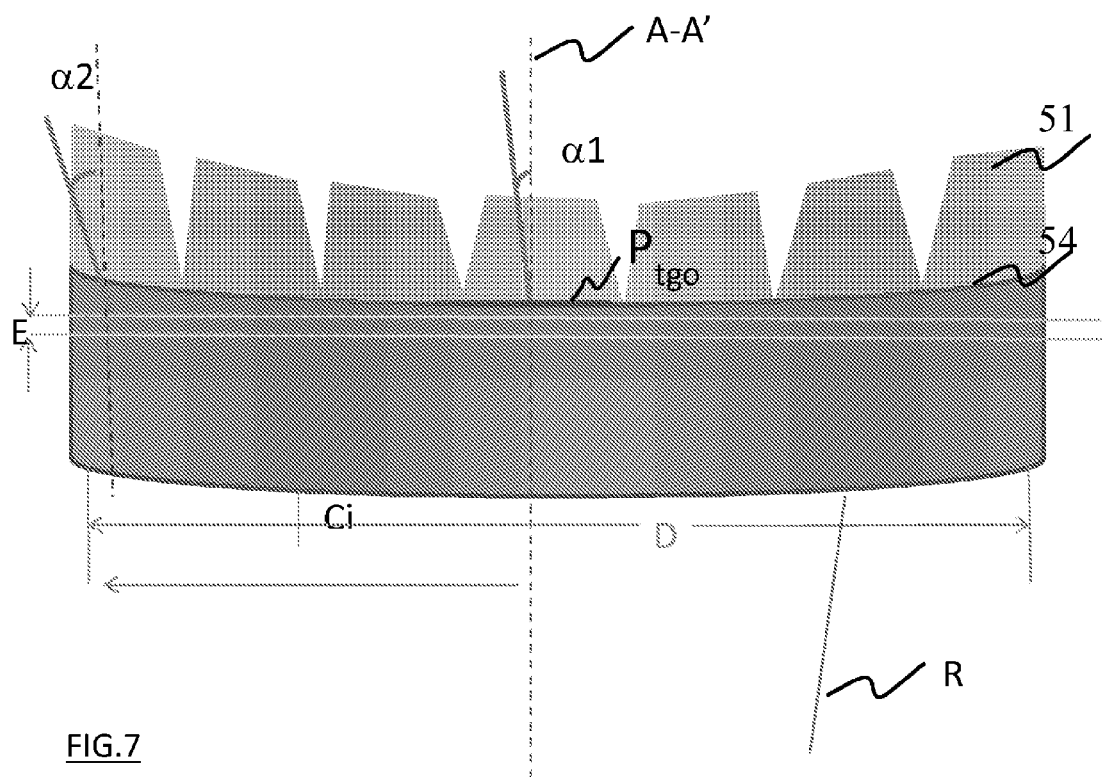
FIG. 7 illustrates the case of a convex wafer.

Throughout the present text, a wafer will be said to be concave if its face opposite its front face is concave (see FIG. 6); it will be said to be convex when this face is itself convex (see FIG. 7).

More precisely, the offcut angle, equal to a first non-zero value in the center of the wafer, tends to
decrease towards the periphery along the symmetry plane when the wafer is concave,
increase towards the periphery along the symmetry plane when the wafer is convex.

radius of curvature is less than 20 meters. By way of example, the free-standing GaN crystal of FIG. 3 has a concavity corresponding to a radius of curvature of 15 meters.

Before machining, one creates a profile of the various dimensions (hereafter dimensions Ci) between the face of crystal 5 opposite the upper face 52 and a given reference plane. This makes it possible to define the exact curvature profile of the crystal 5. Such a measurement is for example carried out by means of a micrometric sensor (Starrett-type, for example).

By the least-squares method, it is possible to define for the crystal an optimal tangent plane $P_{tgo}$. This $P_{tgo}$ is for example selected such that the sum of the squares of the variations of the dimensions Ci taken by using said plane as a reference plane is as small as possible.

After identification of the axis A-A' (axis perpendicular to the $P_{tgo}$ and passing through the center 53 of said growth face 52), the wafer is machined along a plane P parallel to the plane orthogonal to this axis A-A' in a section having a thickness E and a diameter D as represented in FIG. 6. If the thickness E allows it, the initial section may be recut along the plane P into N thinner sections. N and D are a function of the average thickness of the crystal and its radius of curvature.

It is noted that the shape of the wafer may be very well approximated by a segment of a sphere. The axis of symmetry of the segment also has by construction the same direction as the principal axis A-A'.

The table below presents the effect on loss to machining of a deviation of the cutting plane from the principal axis of the crystal.

| Angular deviation from the plane (P) | Linear deviation | Crystal thickness necessary to avoid the presence holes on the front face of the wafer | Crystal thickness necessary to obtain a 500 μm wafer | Relative increase in crystal thickness | Additional time necessary for growth of the crystal | Total duration of growth |
|---|---|---|---|---|---|---|
| 0.00° | 0 μm | 0 μm | 2.2 mm | 0% | 0.00 h | 17.60 h |
| 0.05° | 87 μm | 262 μm | 2.5 mm | 12% | 2.09 h | 19.69 h |
| 0.10° | 175 μm | 524 μm | 2.7 mm | 24% | 4.19 h | 21.79 h |
| 0.15° | 262 μm | 785 μm | 3.0 mm | 36% | 6.28 h | 23.88 h |
| 0.20° | 349 μm | 1047 μm | 3.2 mm | 48% | 8.38 h | 25.98 h |
| 0.25° | 436 μm | 1309 μm | 3.5 mm | 60% | 10.47 h | 28.07 h |
| 0.30° | 524 μm | 1571 μm | 3.8 mm | 71% | 12.57 h | 30.17 h |

Thus, for very large radii of curvature (i.e., greater than 10 meters) and surfaces greater than or equal to four inches, the curvature (concave or convex) of the wafer may vary along one of its diameters (i.e., the wafer may be "gondola"-shaped).

2. Experiments

Figure 5:
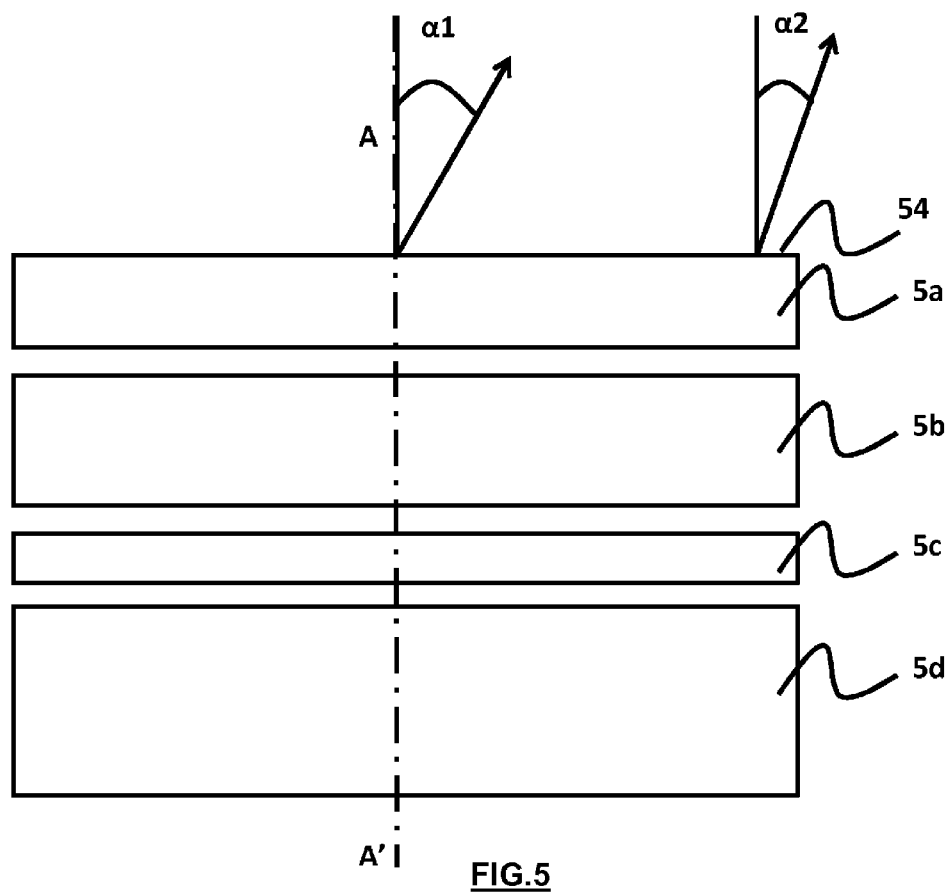
FIG. 5 illustrates an exemplary group-13-element nitride wafer obtained by cutting the crystal illustrated in FIG. 4.

The above-described method makes it possible to obtain a GaN wafer 5a, 5b, 5c, 5d having an offcut angle equal to:
a first non-zero value α1 in the vicinity of the center of the front face 54 of the wafer 5a, and
a second value α2 at the periphery of the front face 54, the second value α2 being less than the first value α1, as illustrated in FIG. 5.

Thus, the method according to the invention makes it possible to obtain GaN wafers of the same type as the wafers described in US 2012/0184090, but while limiting loss of material to machining.

The free-standing curved crystal has a concavity such that its radius of curvature is less than 25 meters. Preferably, the As may be noted in this table, the more the cutting plane is inclined relative to a cutting plane orthogonal to the principal axis of the crystal, the greater the loss of material to machining.

Indeed, the more the cutting plane is inclined relative to the plane P perpendicular to the principal axis of the group-13-element nitride crystal, the greater the thickness of said crystal must be to produce a group-13-element nitride wafer having the desired offcut angle. Beyond the loss of material, this requires a significant increase in growth time and thus a lower yield in terms of production. The reader will have understood that numerous modifications may be made to the above-described method.

In the preceding description, the method according to the invention was described in reference to the fabrication of a semiconductor material including a gallium nitride GaN layer.

However, it is quite obvious to the person skilled in the art that the above-described method may be used to grow a material including a group-13-element nitride layer other than gallium nitride GaN, said material which may be used to produce semiconductor structures such as light-emitting diodes.

The invention claimed is:

1. A method of fabricating group-13-element nitride wafers from a free-standing group-13-element nitride crystal extending longitudinally along a principal axis orthogonal to a growth face of the crystal and passing through the center of said growth face, the crystal having with a growth front forming a non-zero angle with the principal axis,
characterized in that said crystal is curved and in that the method comprises a cutting phase of the free-standing crystal along cutting planes transverse to the crystal and perpendicular to the principal axis of the crystal, so as to obtain group-13-element nitride wafers, each wafer including a front face having a non-zero offcut angle in a region of the front face extending in a radius of 10 millimeters around the center of the front face.

2. The fabrication method as claimed in claim 1, wherein the crystal has a radius of curvature of less than 25 meters.

3. The fabrication method as claimed in claim 2, wherein the crystal has a radius of curvature of less than 20 meters.

4. The fabrication method as claimed in claim 2 wherein the radius of curvature is 5 meters or more.

5. The fabrication method as claimed in claim 2, wherein the crystal has a dislocation density of $10^7$ cm$^{-2}$ or less.

6. The fabrication method as claimed in claim 2, wherein the non-zero offcut angle is between 0.1 and 5 degrees, the cutting planes extending perpendicular to the principal axis of the crystal.

7. The fabrication method as claimed in claim 1, wherein the cutting planes extend:
perpendicular to the principal axis of the crystal, and
parallel to each other along said principal axis,
so as to obtain group-13-element nitride wafers of thickness between 300 microns and 1 millimeter.

8. The fabrication method as claimed in claim 1, which further comprises:
a growth phase of a first group-13-element nitride layer on a starting substrate having a crystallization plane between 0.1 and 5 degrees;
a formation phase of a separation zone;
a regrowth phase to form a second group-13-element nitride layer,
a separation phase to obtain the crystal.

9. The fabrication method as claimed in claim 8, wherein the formation phase of a separation zone comprises the deposition of a silicon layer on the starting substrate, said silicon layer being intended to be spontaneously vaporized during the growth phase of a first group-13-element nitride layer.

10. The fabrication method as claimed in claim 8, wherein the formation phase of a separation zone comprises an ion implantation step, said implantation step which may be implemented before, during or after the growth phase of the first group-13-element nitride layer.

11. The fabrication method as claimed in claim 8, wherein the growth phase of the first group-13-element nitride layer is a phase of epitaxial lateral overgrowth (ELO) or of universal lateral overgrowth (ULO) of the first group-13-element nitride layer.

12. The fabrication method as claimed in claim 11, wherein the growth phase of the first group-13-element nitride layer comprises:
a step of depositing a mask having openings,
a step of growing islands of group-13-element nitride through the openings, the islands having a crystallization plane between 0.1 and 5 degrees,
a lateral growth step to promote the coalescence of the islands in order to obtain the first group-13-element nitride layer.

13. The fabrication method as claimed in claim 8, wherein the growth phase of the first group-13-element nitride layer comprises a step of depositing a group-13-element nitride buffer layer at a temperature between 500 and 700° C.

14. The fabrication method as claimed in claim 13, wherein the growth phase of the first group-13-element nitride layer comprises a step of annealing the buffer layer at a temperature between 900 and 1150° C. so as to convert the initially continuous buffer layer into a discontinuous layer of group-13-element nitride features.

15. A group-13-element nitride wafer that can be obtained by implementing the method as claimed in claim 1, which comprises a front face having a non-zero offcut angle in the vicinity of the center of the front face characterized in that the front face has a non-zero offcut angle in a region of the face extending in a radius of 10 millimeters around the center of the front face.

16. A group-13-element nitride wafer as claimed in claim 15, which comprises a front face having a non-zero offcut angle in the vicinity of the center of the front face, characterized in that the offcut angle values are distributed in a substantially symmetrical way around a symmetry plane containing:
a principal axis of the wafer orthogonal to the front face and passing through the center of the front face, and
a c-axis orthogonal to a c-oriented crystal plane.

17. The group-13-element nitride wafer as claimed in claim 16, the surface of which opposite its front face is concave, wherein the offcut angle tends to decrease towards the periphery along the symmetry plane.

18. The group-13-element nitride wafer as claimed in claim 16, the surface of which opposite its front face is convex, wherein the offcut angle tends to increase towards the periphery along the symmetry plane.

19. Use of a group-13-element nitride wafer as claimed in claim 16 for fabricating optoelectronic components.

* * * * *